United States Patent
Lin et al.

(10) Patent No.: US 8,542,486 B2
(45) Date of Patent: Sep. 24, 2013

(54) ELECTRONIC APPARATUS WITH IMPROVED HEAT DISSIPATION

(75) Inventors: Wei-Yi Lin, Taipei (TW); Li-Ting Wang, Taipei (TW); Kuang-Chung Sun, Taipei (TW); Ting-Chiang Huang, Taipei (TW); Feng-Ku Wang, Taipei (TV)

(73) Assignee: Inventec Corporation, Taipei (TW)

( * ) Notice: Subject to any disclaimer, the term of this patent is extended or adjusted under 35 U.S.C. 154(b) by 390 days.

(21) Appl. No.: 13/015,596

(22) Filed: Jan. 28, 2011

(65) Prior Publication Data

US 2012/0127652 A1    May 24, 2012

(30) Foreign Application Priority Data

Nov. 19, 2010   (TW) ................................ 99140025 A (51) Int. Cl.
*H05K 7/20*   (2006.01)
*H01L 23/467*   (2006.01)
*H05K 5/00*   (2006.01)
*A47B 77/08*   (2006.01)
*G06F 1/16*   (2006.01)
*G06F 1/20*   (2006.01)

(52) U.S. Cl.
CPC ............ *H01L 23/467* (2013.01); *G06F 1/1667* (2013.01); *G06F 1/203* (2013.01)
USPC .................. 361/693; 361/679.46; 361/679.12; 454/184; 174/547; 312/236

(58) Field of Classification Search
USPC ....... 361/679.46–679.54, 688–723; 454/184; 165/80.1–80.5, 104.33, 185; 257/712–722; 174/15.1–15.2, 16.1–16.3, 526, 547; 312/236
See application file for complete search history.

(56) References Cited

U.S. PATENT DOCUMENTS

| | | | | | |
|---|---|---|---|---|---|
| 5,168,427 | A | * | 12/1992 | Clancy et al. | ............ 361/679.12 |
| 5,534,891 | A | * | 7/1996 | Takano | ........................ 345/169 |
| 5,552,960 | A | * | 9/1996 | Nelson et al. | ............ 361/679.54 |
| 5,754,395 | A | * | 5/1998 | Hsu et al. | ................. 361/679.11 |
| 5,764,474 | A | * | 6/1998 | Youens | ..................... 361/679.12 |
| 6,091,600 | A | * | 7/2000 | Jeong | ......................... 361/679.12 |
| 6,144,554 | A | * | 11/2000 | Mok | ........................ 361/679.08 |
| 6,175,492 | B1 | * | 1/2001 | Nobuchi | .................. 361/679.08 |
| 6,181,554 | B1 | * | 1/2001 | Cipolla et al. | ........... 361/679.46 |

(Continued)

FOREIGN PATENT DOCUMENTS

CN   201090997 Y   7/2008
TW   I325295       5/2010

*Primary Examiner* — Zachary M Pape
(74) *Attorney, Agent, or Firm* — CKC & Partners Co., Ltd.

(57) ABSTRACT

An electronic apparatus with improved heat dissipation comprises a first body with a first shell and a second shell, a second body, a coupling device and a linkage device. The first shell is pivotally connected to the second shell to form an accommodation space. The first shell can pivot relative to the second shell to enlarge the accommodation space and form an opening between the first shell and the second shell. The coupling device couples the second body and the second shell to pivot the second body relative to the second shell to expose or hide the first shell. The linkage device drives the first shell to pivot relative to the second shell. When the second body pivots relative to the second shell toward a first direction, the linkage device drives the first shell to pivot relative to the second shell toward a second direction opposite to the first direction.

9 Claims, 7 Drawing Sheets

(56) References Cited

U.S. PATENT DOCUMENTS

| | | | |
|---|---|---|---|
| 6,459,573 B1 * | 10/2002 | DiStefano et al. | 361/679.46 |
| 6,853,543 B1 * | 2/2005 | Moore et al. | 361/679.12 |
| 7,630,195 B2 * | 12/2009 | Lin | 361/679.26 |
| 7,894,184 B2 * | 2/2011 | Huang et al. | 361/679.48 |
| 2008/0073344 A1 * | 3/2008 | Kung et al. | 220/230 |
| 2010/0165567 A1 * | 7/2010 | Shih et al. | 361/679.48 |

\* cited by examiner

ELECTRONIC APPARATUS WITH IMPROVED HEAT DISSIPATION

RELATED APPLICATIONS

This application claims priority to Taiwan Application Serial Number 099140025, filed Nov. 19, 2010, which is herein incorporated by reference.

BACKGROUND

1. Field of Invention

The present invention relates to an electronic apparatus, and more particularly, to an electronic apparatus with improved heat dissipation.

2. Description of Related Art

Figure 1:
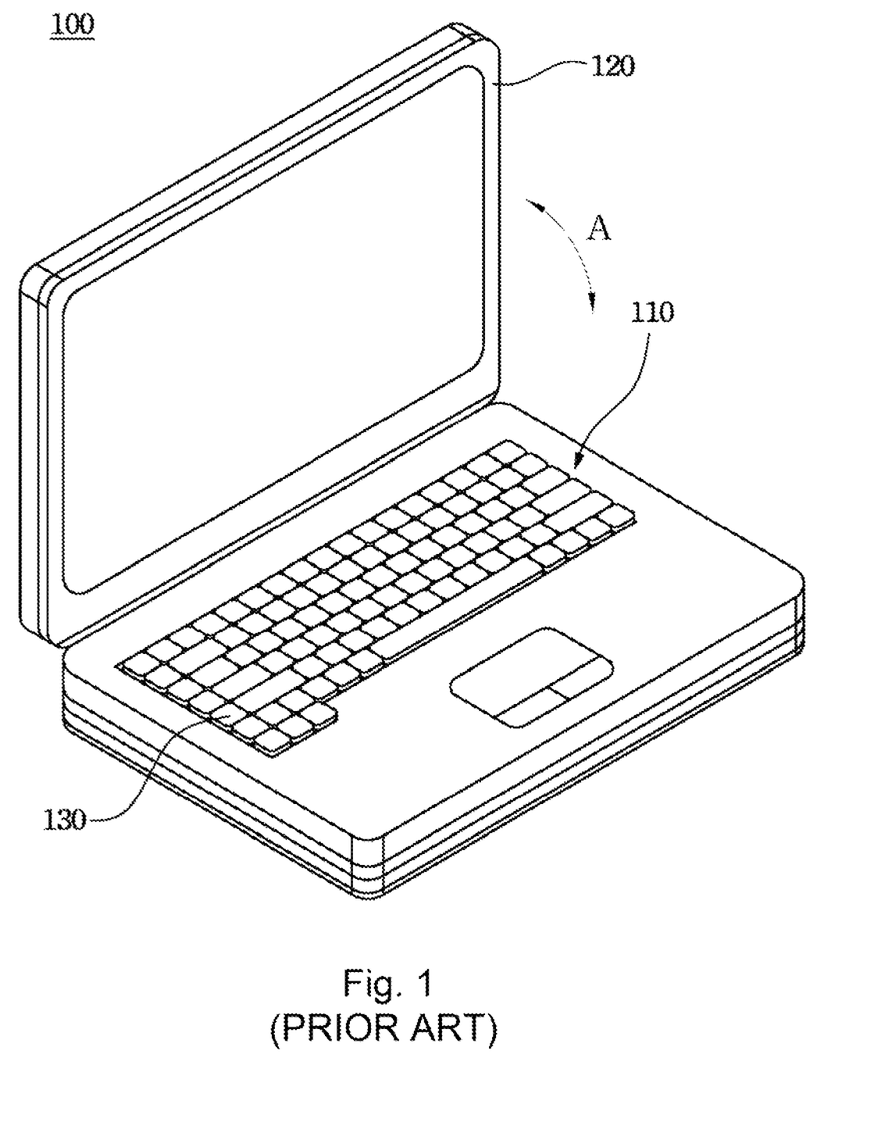
FIG. 1 is a schematic view of a conventional notebook computer.

FIG. 1 is a schematic view of a conventional notebook computer. The notebook computer 100 includes a main body 110 and a screen body 120. A keyboard 130 is disposed on the main body 110, and the screen body 120 can pivot relative to the main body 110 (as shown by an arrow A).

Due to the increasingly rapid development of science and technology, the amounts of processing data that can be performed by the notebook computer 100 are becoming more and more, thereby causing electronic elements in the main body 110 of the notebook computer 100 to generate a large amount of heat energy due to great increase of the amounts of processing data. Conventionally, the heat energy produced by the electronic elements in the main body 110 is expelled out of the shell by running a heat dissipation fan, thereby achieving the object of heat dissipation. However, hot gas cannot be discharged out of the main body 110 effectively when one single fan is actuated, due to a constant flow guide area and a constant flow rate.

On the other hand, the keyboard 130 disposed on the main body 110 of the notebook computer 100 generally adopts a horizontal design, and an opening angle between the screen body 120 and the main body 110 can be adjusted by a user according to a desired view angle in operation. However, with respect to the keyboard 130 with a horizontal design, as there is no mechanism for adjusting an input angle, the user merely can change a manner for placing the main body to obtain an appropriate input angle of the keyboard 130, e.g. use another article to lift up the main body 110.

Therefore, the conventional notebook computer 100 generally has disadvantages of poor heat dissipation efficiency and inconvenient usage.

SUMMARY

The present invention aims to provide an electronic apparatus which can improve the heat dissipation efficiency, wherein, through a design of a linkage device, a first shell is jacked up at the same time when a user opens a screen of the electronic apparatus, thereby producing an additional gap to increase the heat dissipation effect. An aspect of the present invention provides an electronic apparatus with improved heat dissipation, and the electronic apparatus includes a first body with a first shell and a second shell, a second body, a coupling device and a linkage device. The first shell is pivotally connected to the second shell to form an accommodation space. The first shell can pivot relative to the second shell and thus ascend to enlarge the accommodation space and form an opening between the first shell and the second shell. The coupling device pivotally connects the second body and the second shell so as to pivot the second body relative to the second shell to expose or hide the first shell. The linkage device is operable to drive the first shell to pivot relative to the second shell. When the second body pivots relative to the second shell toward a first direction, the linkage device drives the first shell to pivot relative to the second shell toward a second direction opposite to the first direction.

In an embodiment, the first body is a main body of a notebook computer, and the second body includes a screen of the notebook computer.

In an embodiment, the first body further includes a keyboard module, and the keyboard module is engaged with the first shell.

In an embodiment, the linkage device is a bump, and the bump is formed on the coupling device.

In an embodiment, the linkage device includes a first gear and a second gear, wherein the first gear has a first guide rail and is disposed in the accommodation space, and the second gear has a second guide rail and is fastened on the coupling device, and the first guide rail gears with the second guide rail.

In an embodiment, the linkage device is a spring, and the spring is disposed in the accommodation space.

In an embodiment, the first body further includes a metal mesh. The metal mesh is disposed along the inner side surface of the first shell and the inner side surface of the second shell, and the metal mesh is fastened on the bottom of the first shell. The first body further includes a trough-shaped structure, and the trough-shaped structure is formed on the inner side surface of the second shell. When the first shell pivots relative to the second shell and descends, the metal mesh is partially disposed in the trough-shaped structure, and when the first shell pivots relative to the second shell to ascend, the metal mesh covers the opening formed between the first shell and the second shell.

In an embodiment, a magnetic force mechanism is further included to assist the second body to pivot relative to the first body so as to hide the keyboard module. The magnetic force mechanism includes a magnet disposed in the first body and an iron plate disposed in the second body.

To sum up, in the present invention, through the design of the linkage device, the first shell can be jacked up at the same time when the user opens the screen of the electronic apparatus. Thus, an additional gap is produced to increase the heat dissipation effect, and meanwhile the operation angle of the first shell is adjusted to make it convenient for the user to perform an input action.

It is to be understood that both the foregoing general description and the following detailed description are by examples, and are intended to provide further explanation of the present invention as claimed.

BRIEF DESCRIPTION OF THE DRAWINGS

In order to make the foregoing as well as other aspects, features, advantages, and embodiments of the present invention more apparent, the accompanying drawings are described as follows.

DETAILED DESCRIPTION

Figure 2A:
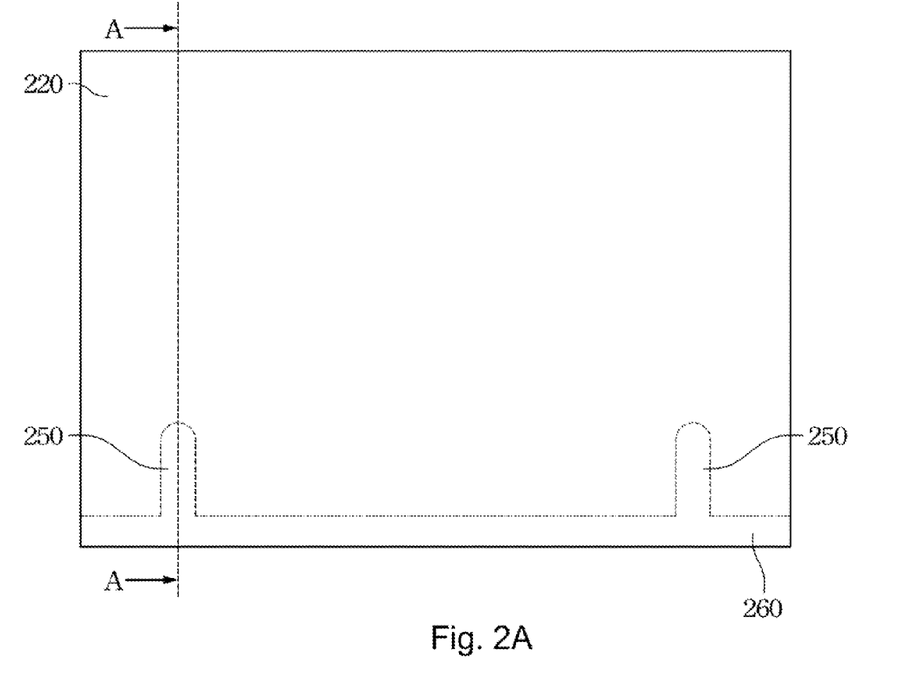
FIG. 2A is a top view of a handheld electronic apparatus according to a preferred embodiment of the present invention.
Figure 2B:
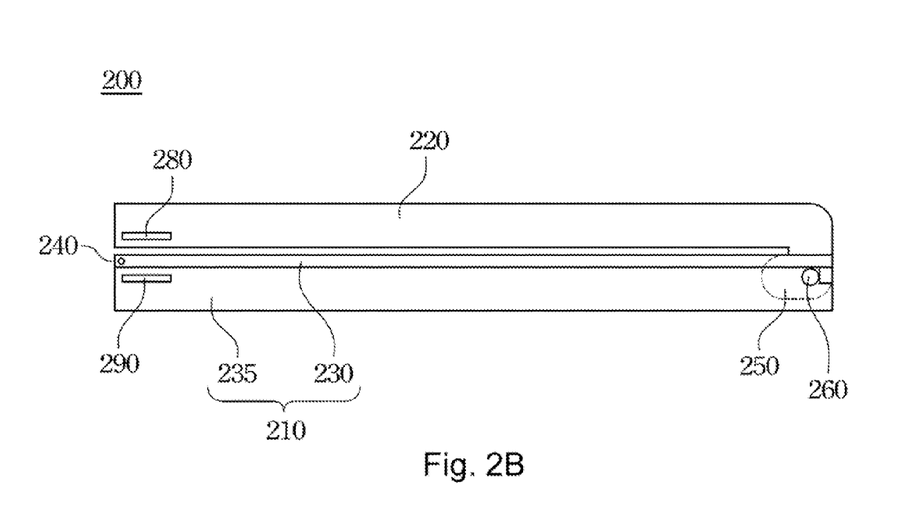
FIG. 2B is a side view viewed along a line AA of FIG. 2A.
Figure 2C:
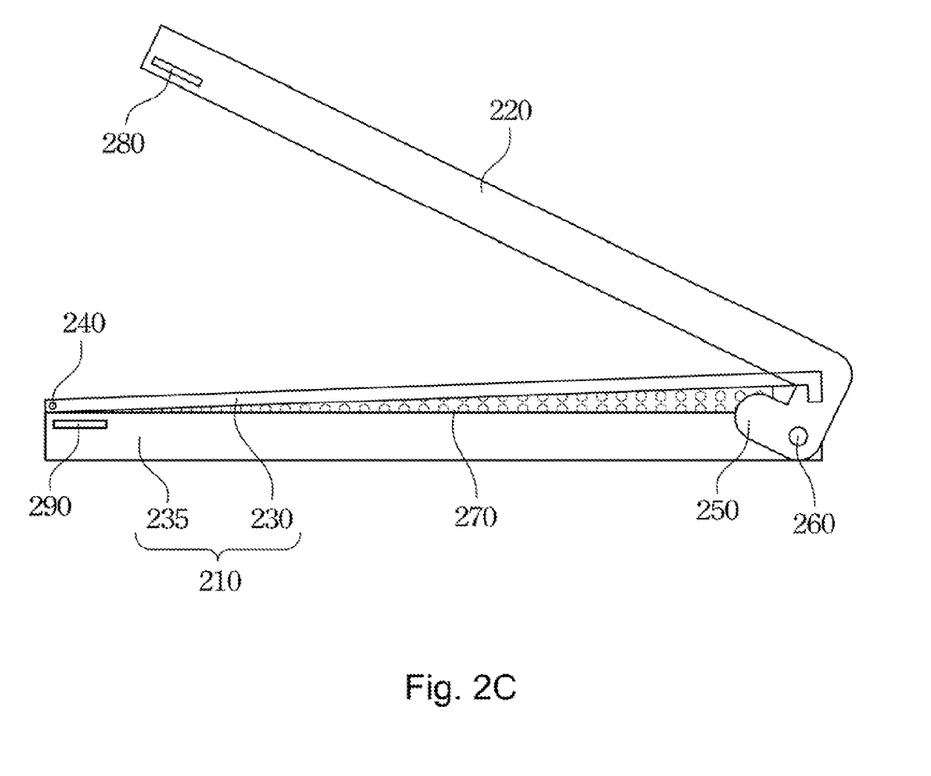
FIGS. 2C-2D are respectively process views of jacking up a first shell by using a linkage device, according to a preferred embodiment of the present invention.
Figure 2D:
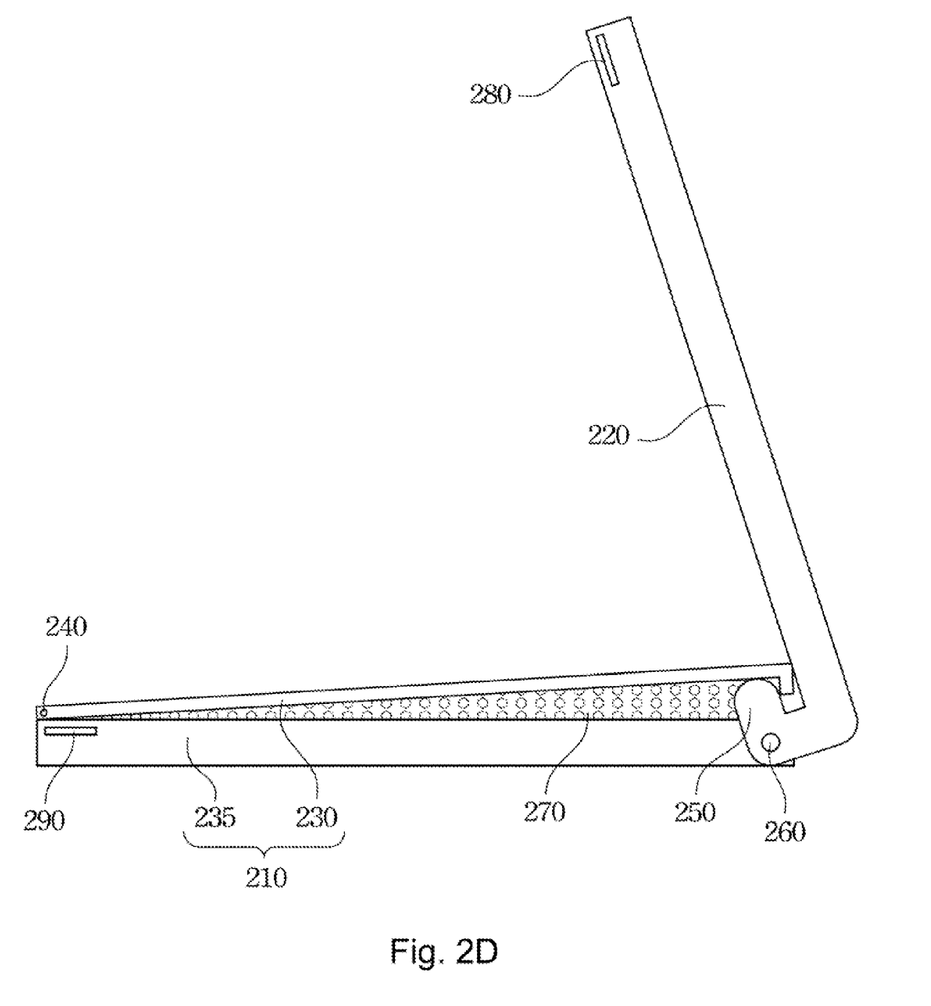

FIG. 2A is a top view of a handheld electronic apparatus according to a preferred embodiment of the present invention. FIG. 2B is a side view viewed along a line AA of FIG. 2A. FIGS. 2C-2D are respectively process views of jacking up a first shell by using a linkage device, according to a preferred embodiment of the present invention. Refer to FIGS. 2A-2D together.

The handheld electronic apparatus 200 includes a first body 210 with a first shell 230 and a second shell 235, a second body 220, coupling devices 240,260, and a linkage device 250. In this embodiment, the handheld electronic apparatus 200 is, for example, a notebook computer. The first body 210 is, for example, a main body of the notebook computer, wherein the first body further includes a keyboard module (not shown), and the keyboard module is engaged with the first shell 230. The second body 220 is, for example, a screen of the notebook computer. The coupling device 240 is, for example, a rotation pivot which couples the first shell 230 and the second shell 235 to form an accommodation space, thereby causing the first shell 230 to pivot relative to the second shell 235 toward the clockwise direction to descend to the second shell 235, or toward the anti-clockwise direction to ascend for enlarging the accommodation space and forming an opening between the first shell 230 and the second shell 235. The coupling device 260 is, for example, a rotation pivot which couples the second shell 235 and the second body 220. The coupling device 260 can drive the second body 220 to pivot relative to the second shell 235 toward the clockwise direction or the anti-clockwise direction to hide or expose the first shell 230. The linkage device 250 is fastened on the coupling device 260, and protrudes from the coupling device 260 toward the direction of the first body 210, and can be actuated along with the coupling device 260. In an embodiment, the linkage device 250 is a bump structure and has a circular arc appearance, thereby allowing the first shell 230 to be jacked up smoothly and driving the first shell 230 to pivot relative to the second shell 235.

The first body 210 and the second body 220 of FIGS. 2A and 2B are in a closed state. When a user opens the second body 220, i.e., causes the second body 220 of FIG. 2B to pivot relative to the second shell 235 toward the clockwise direction to be in a state of FIG. 2C or 2D, the coupling device 260 correspondingly drives the linkage device 250 to pivot toward the clockwise direction, so that the first shell 230 is jacked up, thereby causing the first shell 230 to pivot relative to the second shell 235 toward the anti-clockwise direction, and thus the first shell 230 ascends to enlarge the accommodation space between the first shell 230 and the second shell 235 and to form an opening between the first shell and the second shell, so as to be in a state of FIG. 2C or 2D. In contrast, when the user closes the second body 220 and the second shell 235, i.e., causes the second body 220 of FIG. 2C or 2D to pivot relative to the second shell 235 toward the anti-clockwise direction to be in a state of FIG. 2B, the coupling device 260 correspondingly drives the linkage device 250 to pivot toward the anti-clockwise direction, so that the first shell 230 pivots relative to the second shell 235 toward the clockwise direction, thereby causing the first shell 230 to hide the second shell 235, as shown in the state of FIG. 2B. In other words, the coupling device 260 and the linkage device 250 of the present invention can respectively drive the second body 220 and the first shell 230 to move toward opposite directions. For example, when the coupling device 260 drives the second body 220 to close toward the second shell 235 in the anti-clockwise direction, the linkage device drives the first shell 230 to move in the clockwise direction and sink into the second shell 235. In contrast, when the coupling device drives the second body 220 to move away from the second shell 235 in the clockwise direction, the linkage device drives the first shell 230 to move in the anti-clockwise direction to move away from the second shell 235.

Moreover, in an embodiment, when the second body 220 and the first body 210 are closed, the second body 220 and the first body 210 can be fixed by using a magnetic force mechanism, thereby preventing the second body 220 and the first body 210 from being separated due to a shake during carrying. For example, this magnetic force mechanism includes a magnet 280 disposed in the second body 220 and an iron plate 290 disposed in the first body 210, or includes a magnet 290 disposed in the first body 210 and an iron plate 280 disposed in the second body 220. When the second body 220 and the first body 210 are closed, the second body 220 and the first body 210 are fixed through the attraction force between the magnet 280 and the iron plate 290.

Figure 2E:
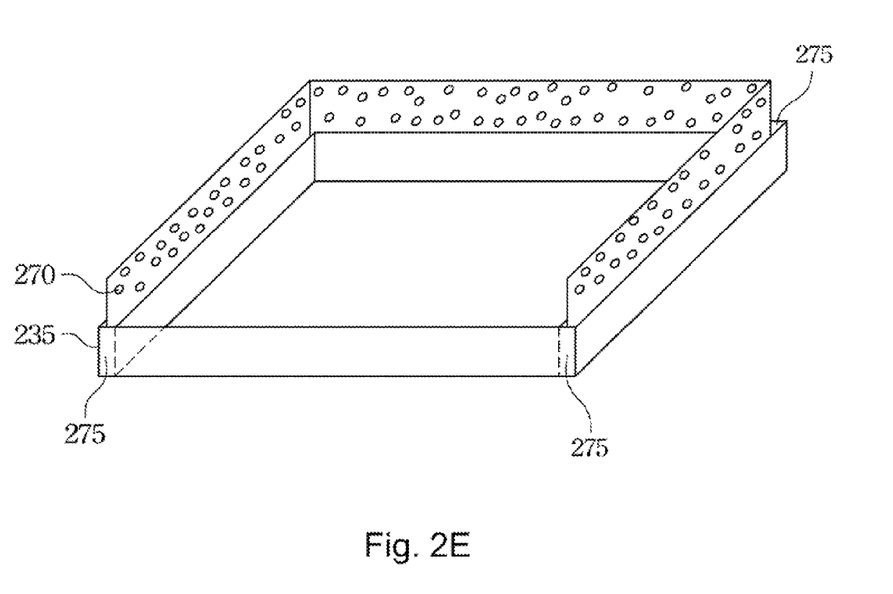
FIG. 2E is a schematic view of a trough-shaped structure according to another preferred embodiment of the present invention.

In another embodiment, a metal mesh 270 is added to the interior side of the shell of the first body 210 to avoid the problem of electromagnetic disturbance (EMI) and to prevent an extraneous matter from entering the first body 210. The metal mesh is disposed along the inner side surface of the first shell 230 and the inner side surface of the second shell 235. The metal mesh 270 can be riveted and fixed on the bottom of the first shell 230, and a trough-shaped structure 275 is disposed in the first body 210, as shown in FIG. 2E. It should be noted that FIG. 2E only shows a relationship among the second shell 235, the metal mesh 270 and the trough-shaped structure 275, and other elements are not shown in FIG. 2E. The trough-shaped structure 275 is disposed on the inner side surface of the second shell 235, and a trough-shaped space is formed between the trough-shaped structure 275 and the inner surface of the second shell 235 to accommodate the metal mesh 270, thereby enabling the metal mesh 270 to move correspondingly along with a movement of the first shell 230. Thus, when the first shell 230 pivots relative to the second shell 235 and descends, the metal mesh 270 is partially disposed in the trough-shaped structure, and when the first shell 230 pivots relative to the second shell 235 and ascend, the metal mesh 270 covers the opening formed between the first shell 230 and the second shell 235.

As can be known from the above description, when the user opens the second body 220 to use the handheld electronic apparatus 200, the first shell 230 is also jacked up correspondingly by the linkage device 250 on the coupling device 260, so that the first shell 230 forms an inclined angle with the second shell 235. With the inclined angle, an additional gap can be produced between the first shell 230 and the second shell 235 to increase with the heat dissipation efficiency of electronic elements in the second shell 235, thereby avoiding a problem of high heat accumulation due to a long time use. In addition, the user can begin to operate the keyboard module which is engaged with the first shell 230 in an operation environment with high affinity. It should be noted that, in this embodiment, persons of ordinary skills in the art can change the inclined angle of the first shell 230 jacked up by changing the bump structure of the linkage device.

Figure 3A:
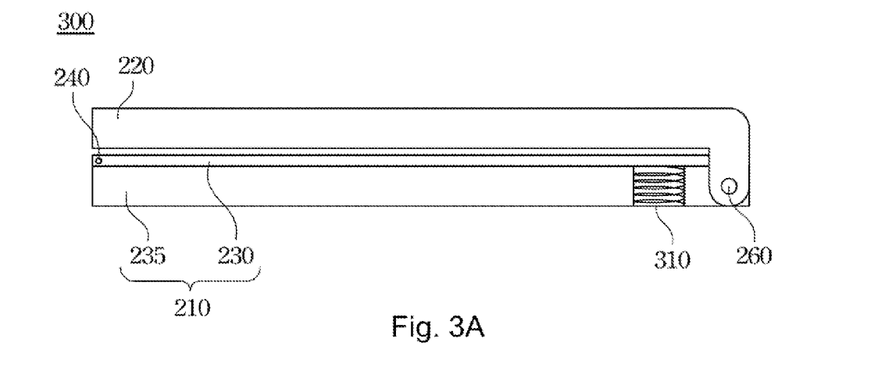
FIG. 3A is a side view of a handheld electronic apparatus according to another preferred embodiment of the present invention.
Figure 3B:
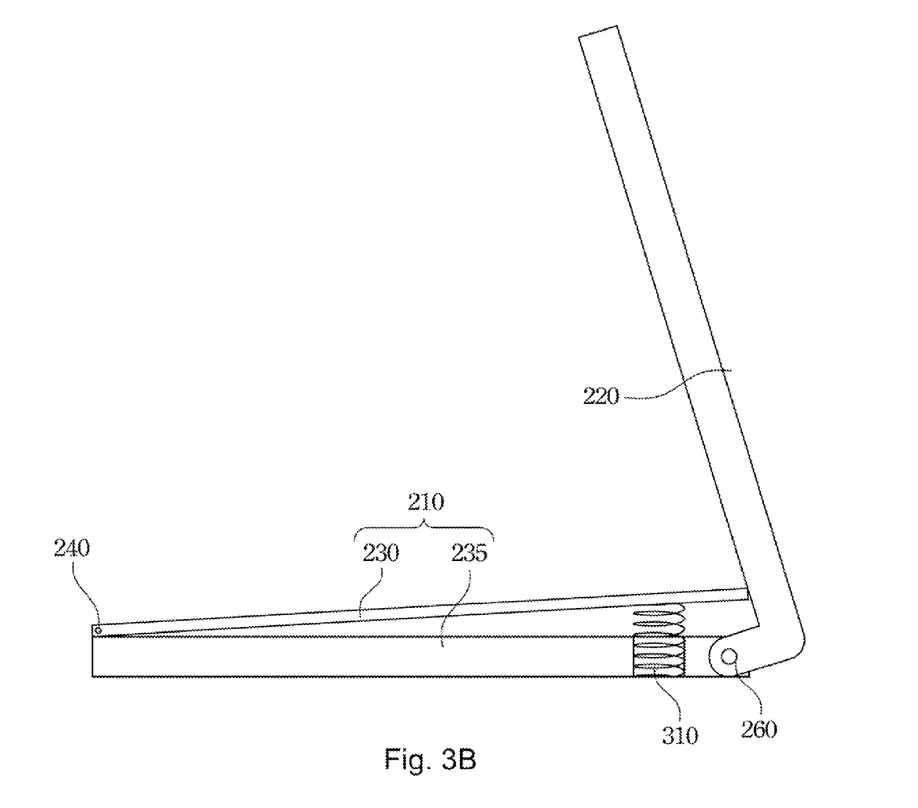
FIG. 3B is a schematic view of jacking up a first shell by using a linkage device, according to another preferred embodiment of the present invention.

In another embodiment, the linkage device of the present device can be implemented by using a spring. FIG. 3A is a side view of a handheld electronic apparatus according to another preferred embodiment of the present invention. FIG. 3B is a schematic view of jacking up a first shell by using a linkage device, according to another preferred embodiment of the present invention. Referring to both FIGS. 3A and 3B, the handheld electronic apparatus 300 includes a first body 210 with a first shell 230 and a second shell 235, a second body 220, a coupling device 240,260, and a linkage device 310. The coupling device 240 is, for example, a rotation pivot which couples the first shell 230 and the second shell 235 to form an accommodation space, so that the first shell 230 can pivot relative to the second shell 235 toward the clockwise direction and descend into the second shell 235, or toward the anti-clockwise direction to ascend for enlarging the accommodation space and forming an opening between the first shell 230 and the second shell 235. In this embodiment, the linkage device 310 is a spring which is disposed in the accommodation space. When a user opens the second body 220, i.e., causes the second body 220 to pivot relative to the second shell 235 toward the clockwise direction, the linkage device 310 can jack up the first shell 230 through the elastic force, i.e., the first shell 230 pivots relative to the second shell 235 toward an anti-clockwise direction to be in a state of FIG. 3B. In contrast, when the user closes the second body 220 toward the second shell 235, i.e., causes the second body 220 to pivot relative to the second shell 235 toward an anti-clockwise direction, the linkage device 310 is compressed, so that the first shell 230 pivots relative to the second shell 235 toward a clockwise direction to hide the second shell 235, as shown in a state of FIG. 3A. It should be noted that, in this embodiment, persons of ordinary skills in the art can change an inclined angle of the first shell 230 jacked up by changing the elasticity of the spring.

Figure 4:
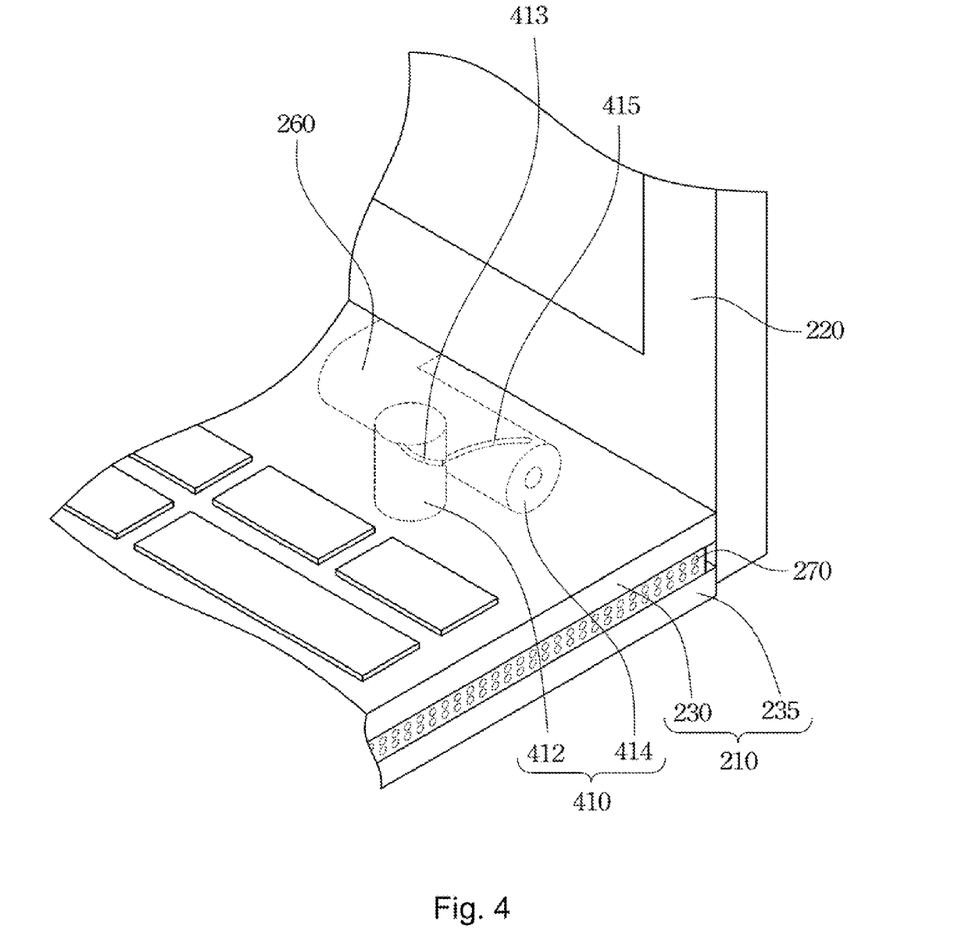
FIG. 4 is a schematic view of a linkage device according to another preferred embodiment of the present invention.

In another embodiment, the linkage device of the present invention can also be implemented by using a gear structure. FIG. 4 is a schematic view of a linkage device according to another preferred embodiment of the present invention. The linkage device 410 includes a first gear 412 and a second gear 414. The first gear 412 has a guide rail 413 and is disposed in the accommodation space between the first shell 230 and the second shell 235. The second gear 414 has a guide rail 415, and is fastened on the coupling device 260 between the first body 210 and the second body 220, and can be actuated along with the coupling device 260. The guide rail 413 gears with the guide rail 415, so that the first gear 412 is linked up with the second gear 414. In a preferred embodiment, when the second gear 414 rotates toward the clockwise direction, the first gear 412 can be brought to screw out upwards through the gearing of the guide rail 413 with the guide rail 415. In contrast, when the second gear 414 rotates toward the anti-clockwise direction, the first gear 412 can be brought to screw in downwards through the gearing of the guide rail 413 with the guide rail 415.

Thus, when the user opens the second body 220, i.e., causes the second body 220 to pivot relative to the second shell 235 toward the clockwise direction, the coupling device 260 correspondingly drives the second gear 414 to pivot toward a clockwise direction and correspondingly drives the first gear 412 to screw out upwards, so that the first shell 230 pivots relative to the second shell 235 toward the anti-clockwise direction to jack up the first shell 230. In contrast, when the user closes the second body 220 toward the second shell 235, i.e., causes the second body 220 to pivot relative to the second shell 235 toward the anti-clockwise direction, the coupling device 260 correspondingly drives the second gear 414 to pivot toward the anti-clockwise direction and correspondingly drives the first gear 412 to screw in downwards, so that the first shell 230 pivots relative to the second shell 235 toward the clockwise direction to hide the second shell 235. It should be noted that, in this embodiment, persons of ordinary skills in the art can achieve a desirable inclined angle of the first shell by changing a radian of a guide rail.

To sum up, in the present invention, through the design of the linkage device, the first shell can be jacked up at the same time when the user opens the screen of the electronic apparatus. Thus, an additional gap is produced to increase the heat dissipation effect, and meanwhile the operation angle of the first shell is adjusted to make it convenient for the user to perform an input action.

Although the present invention has been disclosed with reference to the above embodiments, these embodiments are not intended to limit the present invention. It will be apparent to those skilled in the art that various modifications and variations can be made without departing from the scope or spirit of the present invention. Therefore, the scope of the present invention shall be defined by the appended claims.

What is claimed is:

1. An electronic apparatus with improved heat dissipation, comprising:
    a first body with a first shell and a second shell, wherein the first shell is pivotally connected to the second shell to form an accommodation space, and the first shell is operable to pivot relative to the second shell and thus to ascend so as to enlarge the accommodation space and form an opening between the first shell and the second shell, wherein the first body further comprises a metal mesh, wherein the metal mesh is disposed along an inner side surface of the first shell and an inner side surface of the second shell, and the metal mesh is fastened on a bottom of the first shell;
    a second body;
    a coupling device pivotally connecting the second body and the second shell so as to pivot the second body relative to the second shell for exposing or hiding the first shell; and
    a linkage device operable to drive the first shell to pivot relative to the second shell, wherein
    when the second body pivots relative to the second shell toward a first direction, the linkage device drives the first shell to pivot relative to the second shell toward a second direction opposite to the first direction.

2. The electronic apparatus with improved heat dissipation of claim 1, wherein the first body is a main body of a notebook computer, and the second body comprises a screen of the notebook computer.

3. The electronic apparatus with improved heat dissipation of claim 1, wherein the first body further comprises a keyboard module, and the keyboard module is engaged with the first shell.

4. The electronic apparatus with improved heat dissipation of claim 1, wherein the linkage device is a bump, and the bump is formed on the coupling device.

5. The electronic apparatus with improved heat dissipation of claim 1, wherein the linkage device comprises a first gear and a second gear, wherein the first gear has a first guide rail and is disposed in the accommodation space, the second gear has a second guide rail and is fastened on the coupling device, and the first guide rail gears with the second guide rail.

6. The electronic apparatus with improved heat dissipation of claim 1, wherein the linkage device is a spring, and the spring is disposed in the accommodation space.

7. The electronic apparatus with improved heat dissipation of claim 1, wherein the first body further comprises a trough-shaped structure, and the trough-shaped structure is formed on the inner side surface of the second shell, wherein when the first shell pivots relative to the second shell to descend, the metal mesh is partially disposed in the trough-shaped structure, and when the first shell pivots relative to the second shell to ascend, the metal mesh covers the opening formed between the first shell and the second shell.

8. The electronic apparatus with improved heat dissipation of claim 1, further comprising a magnetic force mechanism for assisting the second body to pivot relative to the first body so as to hide the keyboard module.

9. The electronic apparatus with improved heat dissipation of claim 8, wherein the magnetic force mechanism comprises a magnet disposed in the first body and an iron plate disposed in second body.

* * * * *